(12) United States Patent
Choi

(10) Patent No.: US 6,723,617 B1
(45) Date of Patent: Apr. 20, 2004

(54) METHOD OF MANUFACTURING A SEMICONDUCTOR DEVICE

(75) Inventor: Myung Gyu Choi, Chungjoo-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/310,867

(22) Filed: Dec. 6, 2002

(30) Foreign Application Priority Data

Oct. 14, 2002 (KR) .................................. 10-2002-0062419

(51) Int. Cl.[7] ........................ H01L 21/76; H01L 21/311; H01L 21/302
(52) U.S. Cl. ........................ 438/424; 438/435; 438/437; 438/700; 438/735; 438/739; 438/740
(58) Field of Search ................................. 438/296, 424, 438/435, 437, 700, 735, 737–740

(56) References Cited

U.S. PATENT DOCUMENTS 6,080,637 A  *  6/2000  Huang et al. ............... 438/424

OTHER PUBLICATIONS

Seok–Woo Lee, et al.; Gate Oxide Thinning Effects at the Edge of Shallow Trench Isolation in the Dual Gate Oxide Process; 1999 IEEE; pp. 249–252.

K. Horita, et al.; Advanced Shallow Trench Isolation to Suppress the Inverse Narrow Channel Effects for 0.24$\mu$m Pitch Isolation and Beyond; 2000 IEEE; pp. 178–179.

* cited by examiner

*Primary Examiner*—Amir Zarabian
*Assistant Examiner*—Toniae M. Thomas
(74) *Attorney, Agent, or Firm*—Jacobson Holman PLLC

(57) ABSTRACT

The present invention relates to a method of manufacturing a semiconductor device. When a trench of a STI structure is formed, a portion of a pad nitride film on an active region is removed. Thus, formation of a moat around an upper corner portion of the trench of the STI structure is prevented. Also, the upper corner portion of the trench is rounded. Therefore, a parasitic effect, degradation in gate oxide integrity, an inverse narrow effect and a sub-threshold hump phenomenon can be prevented. Further, a breakdown phenomenon, a gate bridge phenomenon and difference in the coupling ratio between gate electrodes can be prevented.

6 Claims, 5 Drawing Sheets

METHOD OF MANUFACTURING A SEMICONDUCTOR DEVICE

BACKGROUND OF THE INVENTION

1. Field of the Invention

The invention relates generally to a method of manufacturing a semiconductor device. More particularly, the invention relates to a method of manufacturing a semiconductor device capable of improving a characteristic of the device and reducing the manufacture cost, by preventing formation of a moat generating around the top corner of a trench having a STI (shallow trench isolation) structure.

2. Description of the Prior Art

Generally, in order to isolate between-semiconductor devices, the semiconductor substrate is defined into an active region and a field region. Next, a semiconductor device is formed in the active region and a device isolation film for isolation the devices is formed in the field region.

A method for forming the device isolation film of the semiconductor device includes one by which a trench of a STI (shallow trench isolation) structure is formed and the device isolation film for isolating the devices is them. The method by which the trench of the STI structure is formed to isolate the devices will be described in short. A silicon substrate in the field region is etched by a depth of about 3500 Å to form the trench. A high-density plasma (HDP) oxide film is then deposited. Next, the oxide film is polished by a chemical mechanical polishing (CMP) process.

FIG. 1 is a TEM (transmission electron microscope) photography of the semiconductor device in which the device isolation film is formed according to a prior art.

Referring now to FIG. 1, in the conventional technology of forming the device isolation film having the STI structure, a moat (see portion 'M' in FIG. 1) is formed at a field oxide film where the active region and the field region meet by means of a pre-cleaning process for forming a gate oxide film, a subsequent cleaning process and an etch process for the oxide film. Due to this, a parasitic effect, degradation in gate oxide integrity (GOI), an inverse narrow effect and a sub-threshold hump phenomenon occur.

Further, there are many problems in proceeding subsequent processes. If the gate oxide film is deposited, the gate oxide film at the top corner of the trench is made thin by the moat of the HDP oxide film. This may cause a breakdown when the voltage is applied to the device.

Also, after a polysilicon layer is deposited, the moat that is concaved is formed even at the polysilicon layer at the boundary of the active region and the field region. It makes it difficult to remove polysilicon at this portion. Thus, a gate bridge may be caused due to remaining polysilicon.

In addition, if the CMP process is performed with polysilicon concaved, CMP could not be performed uniformly due to the step of polysilicon. Thus, it makes it difficult to form the gate electrodes of the same shape. In case of the flash device, there is difference in the coupling ratio between the gate electrodes. Due to this, there is a problem that the characteristic of the semiconductor device is degraded.

SUMMARY OF THE INVENTION

The present invention is contrived to solve the above problems and an object of the present invention is to provide a method of manufacturing a semiconductor device capable of preventing generation of a moat, in such a way that a thickness of a pad oxide film is formed by minimum to an extent that stress between a semiconductor substrate and a pad nitride film is mitigated and before a HDP oxide film is deposited, a portion of the pad nitride film is etched to compensate for a portion recessed in a cleaning process.

In order to accomplish the above object, the method of manufacturing a semiconductor device according to the present invention, is characterized in that it comprises the steps of sequentially forming a pad oxide film, a pad nitride film and a screen oxide film on a semiconductor substrate in which an active region and a field region are defined, removing the screen oxide film and the pad nitride film formed in the field region, performing a wet etch process to remove the pad nitride film exposed at the boundary of the active region and the field region, in a lateral direction by a given width, performing a dry etch process using the screen oxide film and an etch mask to remove portions of the pad oxide film and the semiconductor substrate formed in the field region, thus forming a trench, removing the screen oxide film and the pad nitride film in the lateral direction by a given width and simultaneously removing the exposed portion of the pad oxide film, performing an oxidization process to form a rounding oxide film in the exposed portion of the semiconductor substrate, depositing a field oxide film of a thickness by which the trench is sufficiently buried and then polishing the field oxide film, and removing the pad nitride film and the pad oxide film in the active region.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
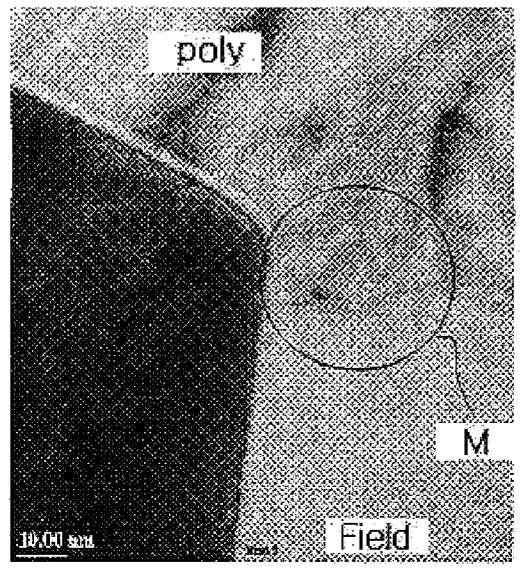
FIG. 1 is a TEM (transmission electron microscope) photography of a semiconductor device in which a device isolation film is formed according to a prior art.

The present invention will be described in detail by way of a preferred embodiment with reference to accompanying drawings, in which like reference numerals are used to identify the same or similar parts.

FIG. 2A through FIG. 2K are cross sectional views of semiconductor devices for explaining a method of the semiconductor device capable of preventing generation of a moat at the boundary of an active region and a field region according to a preferred embodiment of the present invention.

Figure 2A:
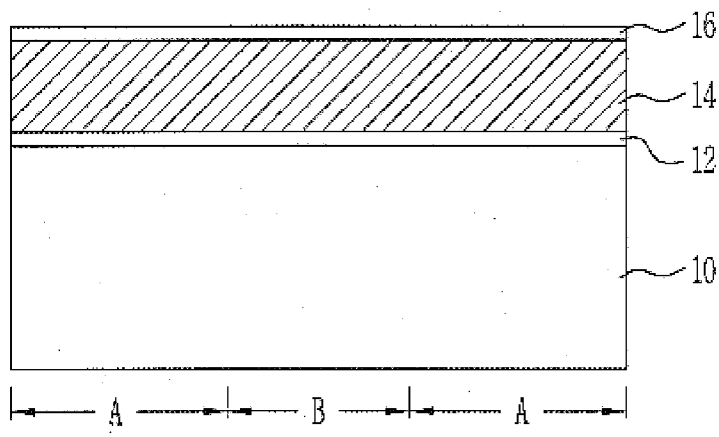
FIG. 2A through FIG. 2K are cross sectional views of semiconductor devices for explaining a method of the semiconductor device capable of preventing generation of a moat at the boundary of an active region and a field region according to a preferred embodiment of the present invention.

Referring now to FIG. 2A, a pad oxide film 12, a pad nitride film 14 and a screen oxide film 16 are sequentially formed on a semiconductor substrate 10 in which an active region 'A' and a field region 'B' are defined.

In more concrete, the pad oxide film 12 is formed to have a thickness that can serve as a barrier for mitigating stress between the semiconductor substrate 10 and the pad nitride film 14 and for protecting the underlying semiconductor substrate 10 when the pad nitride film 14 is etched. For example, the pad oxide film 12 may be thinly formed in thickness of 30 through 150 Å, more preferably about 33 through 75 Å. Thereby, it is possible to reduce, by maximum, time taken to perform a subsequent process for removing the pad oxide film 12. Also, the pad oxide film 12 may be formed using a PE-TEOS (plasma enhanced tetra ethyl ortho silicate) film, a TEOS (tetra ethyl ortho silicate) film, an USG (undoped silicate glass) film, a HDP (high density plasma) film, or the like. However, it should be noted that the type of the film is not limited to them. At this time, the pad nitride film 14 formed on an upper side and an oxide film having a high etch selective ratio can be used as the pad oxide film 12.

The pad nitride film 14 is formed in thickness of 500 through 1500 Å so that it can serve as a stop layer in a subsequent CMP process. At this time, the pad nitride film 14 is deposited using any one of a $SiH_4+NH_3$ gas, a $Si_2H_4+NH_3$ gas and a DCS (Dichlosilane; $SiH_2Cl_2$)+$NH_3$ gas by means of a LP-CVD (low-pressure chemical vapor deposition) method or a PE-CVD (plasma enhanced CVD) method. However, it should be noted that the present invention is not limited to the above description. The pad nitride film 14 may be formed using a nitride film having a high etch selective ratio with the pad oxide film 12 formed on its bottom and the screen oxide film 16 formed on its top.

The screen oxide film 16 is formed in thickness of 100 through 500 Å that can prevent etching of the underlying pad nitride film 14 when a trench is formed and can serve as a mask for forming the trench. The screen oxide film 16 may be formed using the PE-TEOS film, the TEOS film, the USG film, the HDP film, etc. However, it should be noted that the screen oxide film is not limited to the above films. The pad nitride film 14 formed below the screen oxide film 16 and the oxide film having a high etch selective ratio may be used as the screen oxide film 16.

Figure 2B:
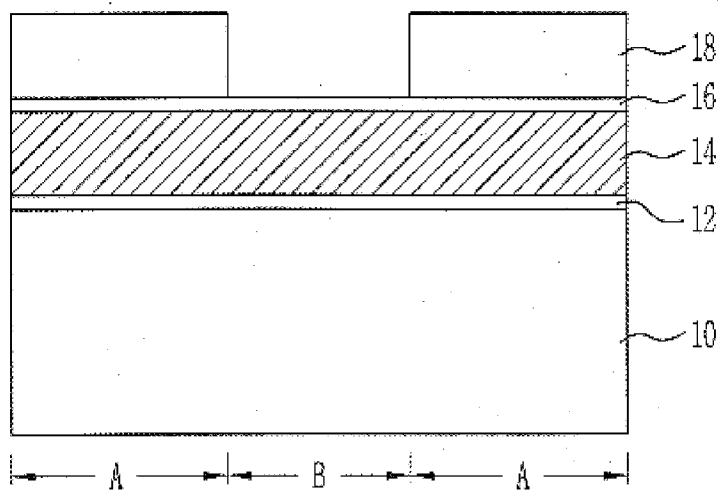

Referring to FIG. 2B, a photoresist film is applied on the screen oxide film 16. A photoresist pattern 18 through the field region 'B' is exposed is formed by means of a photo-lithography process using an exposure mask.

Figure 2C:
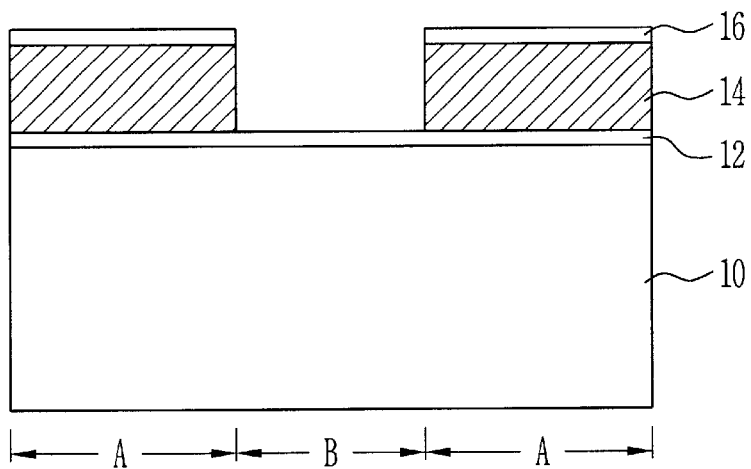

By reference to FIG. 2C, the screen oxide film 16 and the pad nitride film 14 are sequentially removed by an etch process using the photoresist pattern 18 through which the field region 'B' is exposed as an etch mask. The photoresist pattern 18 used as the etch mask is then removed.

At this time, 'lateral direction' to be described later indicates toward the active region 'A' direction at a boundary between the active region 'A' and the field region 'B'. The lateral direction could be a positive X-direction or a negative X-direction along the active region 'A' and the field region 'B' defined in the semiconductor substrate 10.

Figure 2D:
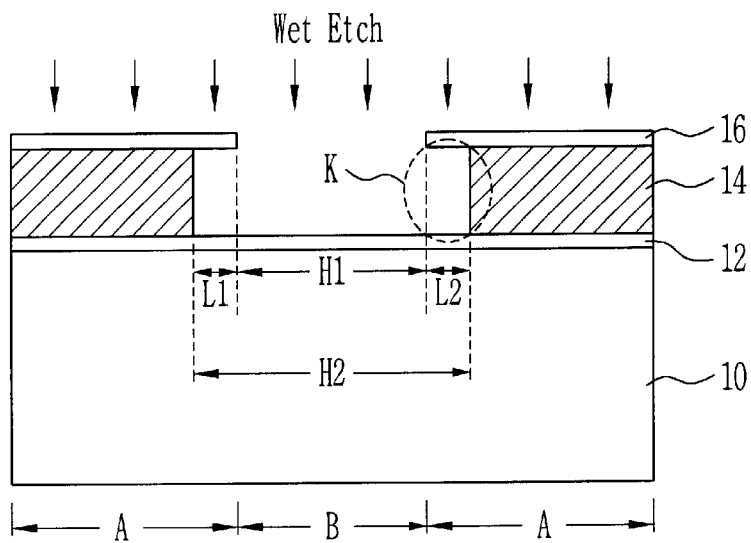

Referring to FIG. 2D, a portion of the pad nitride film 14, which is exposed between the active region 'A' and the field region 'B' and located between the screen oxide film 16 on the active region 'A' and the pad oxide film 12, is removed by a wet etch process. (see portion 'K' in FIG. 2D). In concrete, the exposed portion of the pad nitride film 14 is removed in a lateral direction by the amount of the field oxide film (HDP oxide film) removed by an etch process for forming a subsequent gate oxide film. In other words, the exposed sidewalls of the pad nitride film 14 is etched toward the active region 'A' direction by performing the wet etch process having a high etch selective ratio with the oxide film.

An etch condition of the wet etch process is as follows. Polymer that may be formed at the sidewalls of the pad nitride film 14 is removed in a solution in which the ratio of hydrofluoric acid (HF): $H_2O$ is 1:99. The pad nitride film 14 is removed by a thickness of about 200 through 500 Å by performing the wet etch process using a phosphoric acid ($H_3PO_4$) solution at a temperature of 110 through 130° C. for 300 through 750 second. At this time, the pad oxide film 12 having a high etch selective ratio with the pad nitride film 14 serves as an etch barrier to prevent damage of the underlying semiconductor substrate 10.

By removing in the lateral direction the portion of the pad nitride film 14 exposed between the screen oxide film 16 and the pad oxide film 12 by means of the etch process, a recessed shape (see portion 'K' in FIG. 2D) is formed below the screen oxide film 16. Thereby, the pad oxide film 12 exposed by the field region 'B' defined by the photoresist pattern 18 is further exposed in the active region 'A' direction. At this time, the width of the pad oxide film 12 by the wet etch process is more exposed by about 400 through 1000 Å being the width of the removed pad nitride film 14. By removing the pad nitride film 14 of a given width in the active region a direction, a field oxide film to be removed in a given thickness can be supplemented in the field region 'B' direction in a subsequent etch process of a gate oxide film.

For example, if the width 'H1' of the pad oxide film 12 exposed by the photoresist pattern 18 is 1000 Å and the width 'L1' and 'L2' exposed by the wet etch process for the pad nitride film 14 is 400 through 1000 Å, the total width 'H2' of the exposed pad oxide film 12 is about 1400 through 2000 Å, which is same to the sum (H1+L1+L2) of the width 'H1' exposed by the photoresist pattern 18 and the width 'L1' and 'L2' exposed by etching of the pad nitride film 14.

Figure 2E:
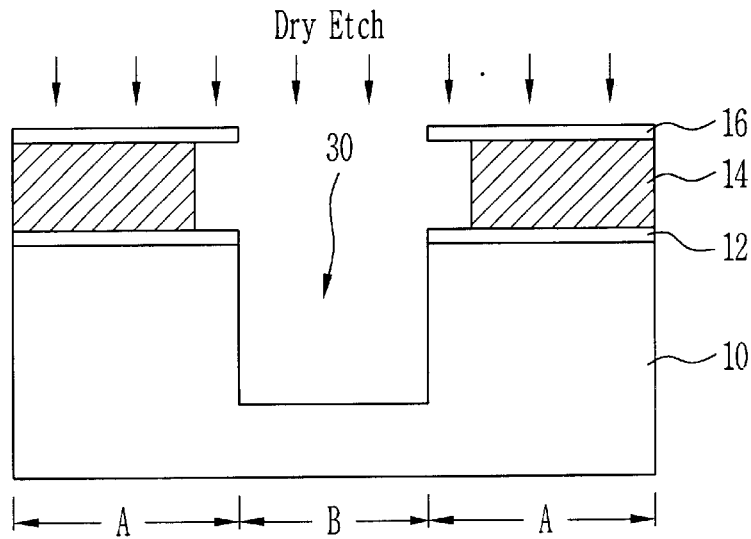

Referring now to FIG. 2E, portions of the pad oxide film 12 and the semiconductor substrate 10 are removed by a dry etch process using the screen oxide film 16 as an etch mask. In concrete, the pad oxide film 12 in the field region 'B' exposed by the screen oxide film 16 is removed using the straightness of the dry etch process, and the portion of the semiconductor substrate 10 exposed by removing the pad oxide film 12 is removed to a trench 30. At this time, the pad oxide film 12 on the active region 'A', which is exposed by removing the portion of the pad nitride film 14 below the screen oxide film 16, is not removed but only the pad oxide film 12 on the field region 'B' is removed. Also, the trench 30 is formed by etching the semiconductor substrate 10 by 3500 through 4000 Å from the upper surface of the substrate 10.

Figure 2F:
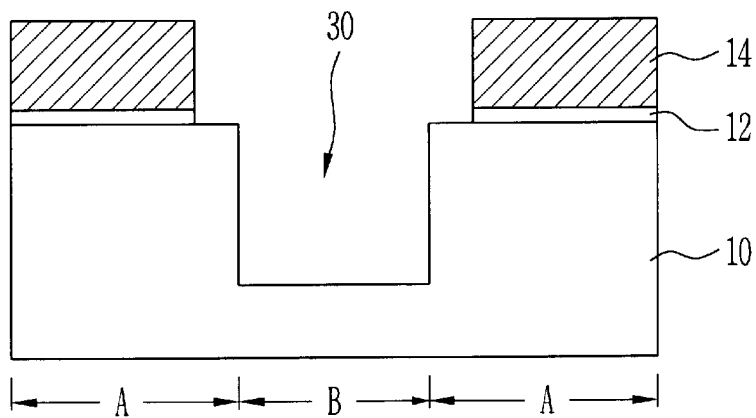

By reference to FIG. 2F, the screen oxide film 16 used as the etch mask for forming the trench 30 is removed. In detail, the surface of the semiconductor substrate 10 is experienced by a post-cleaning process for preventing problems such as contamination, etc. that may occur in a next process is performed using SC-1 (standard cleaning-1; $NH_4OH:H_2O_2:H_2O=1:5:50$) at a temperature of 50° C. for 10 minutes. In order to remove the screen oxide film 16 on the pad nitride film 14, an etch process using an aqueous solution of $HF:H_2O=1:99$ through $HF:H_2O=1:19$ for 100 through 200 seconds is performed. However, it should be noted that the etch conditions are not limited to the mentioned conditions. The screen oxide film 16 on the pad nitride film 14 may be removed by means of various etch methods such as an etch method using plasma, a dry etch method, or the like. At this time, a portion of the semiconductor substrate 10 on the active region 'A' is also exposed by removing the exposed portion of the pad oxide film 12 below the pad nitride film 14.

Figure 2G:
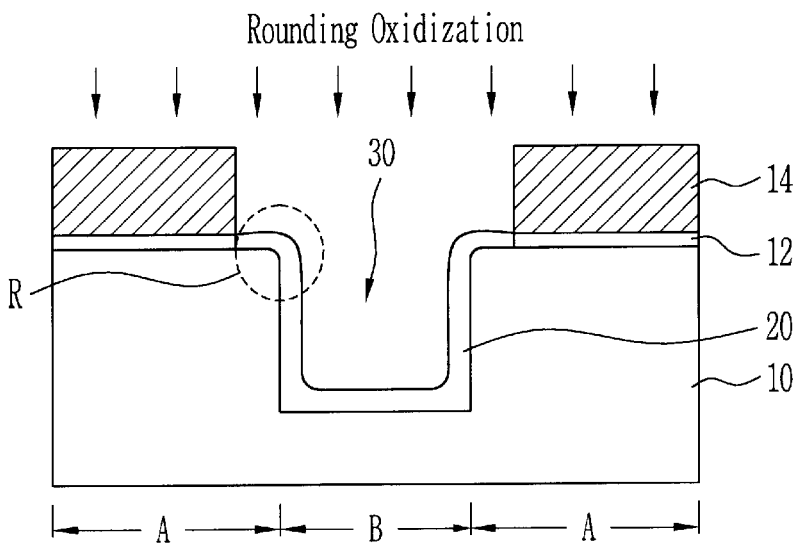

Referring now to FIG. 2G, a rounding oxide film 20 is formed on the semiconductor substrate 10 by means of an oxidization process. In concreter, the rounding oxide film 20 having a thickness of 90 through 110 Å is formed within the trench 30, at the upper corner portion of the trench 30 and the exposed portion of the semiconductor substrate 10 on an upper portion of the active region 'A', by means of a dry oxidization process at a temperature of 950 through 1150° C. Thereby, the upper corner portion of the trench 30 has a rounding shape (see portion 'R' in FIG. 2G). However, it should be noted that the oxidization conditions are not limited to the mentioned oxidization process. Instead, various oxidization methods may be used. The upper corner portion of the trench 30 has the round shape (see portion 'R' in FIG. 2G) through the oxidization process.

Figure 2H:
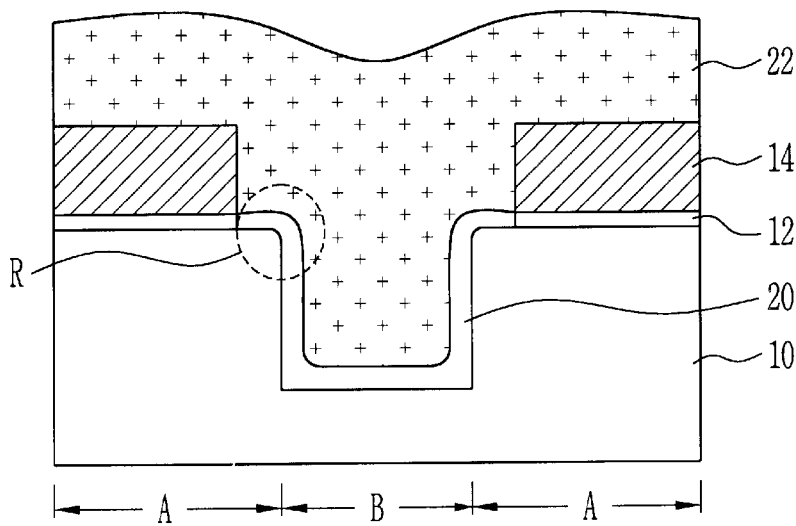

By reference to FIG. 2H, a high-density plasma (HDP) oxide film 22 is deposited on the entire structure to bury the trench 30. A high-temperature annealing process is then performed. In concrete, the HDP oxide film 22 having a thickness of 4000 through 6000 Å is buried to bury the trench 30. The annealing process is performed at a temperature of 900 through 1000° C. for 25 through 35 minutes.

Figure 2I:
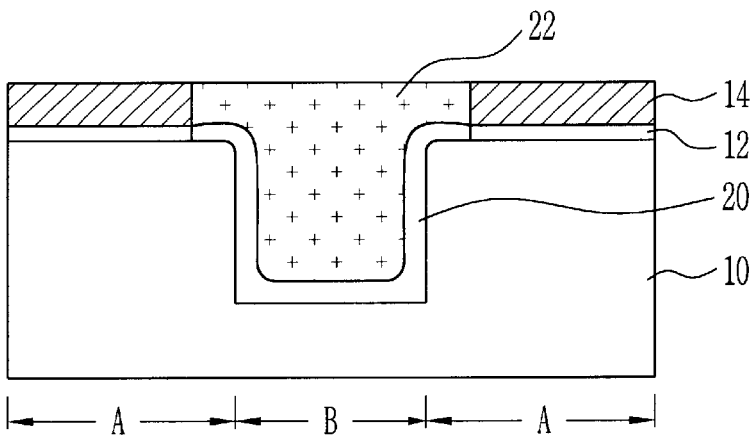

Referring to FIG. 2I, the HDP oxide film 22 on the pad nitride film 14 and a portion of the pad nitride film 14 are moved by a CMP process. At this time, the HDP oxide film 22 is left in thickness of about 400 through 600 Å from the surface of the semiconductor substrate 10 on the active region 'A'. Also, the height of the HDP oxide film 22 is adjusted using the pad nitride film 14 as a stop layer of the CMP process.

Figure 2J:
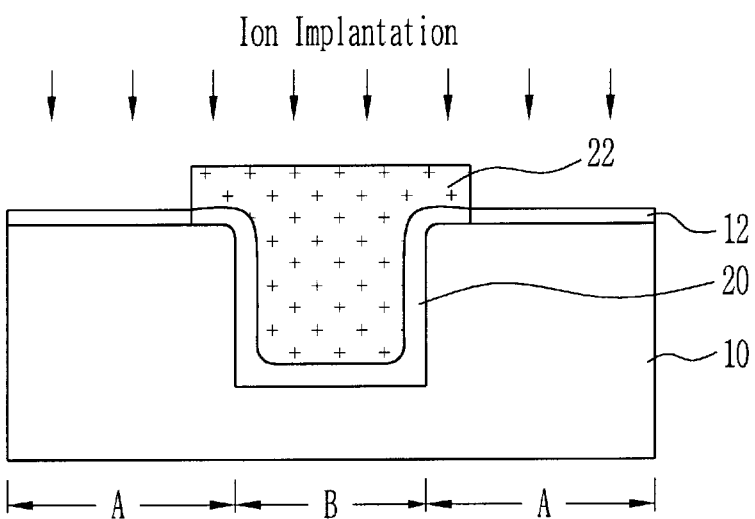

Referring to FIG. 2J, the pad nitride film 14 on an upper side of the active region 'A' is removed to expose the pad oxide film 12. At this time, the HDP oxide film 22 on upper side of the trench 30 has a nipple shape that is protruded by about 200 through 500 Å in the active region 'A' direction at both sides of the field region 'B' as well as the field region 'B' and protruded by about 400 through 600 Å from the semiconductor substrate 10. The critical dimension of the active region 'A' is reduced due to the above shape. However, a target critical dimension can be obtained by removing the HDP oxide film 22 on an upper side of the active region 'A' by the etch process for forming a subsequent gate oxide film.

An ion implantation for forming a well (not shown) is performed to form the well. At this time, a passivation oxide film (not shown) for preventing damage of the underlying semiconductor substrate 10 due to ion implantation without removing the exposed pad oxide film 12 and protecting the semiconductor substrate 10 after the pad oxide film 12 is removed is deposited in order to prevent damage of the surface of the semiconductor substrate 10 when the ion implantation process for forming the well is performed.

Figure 2K:
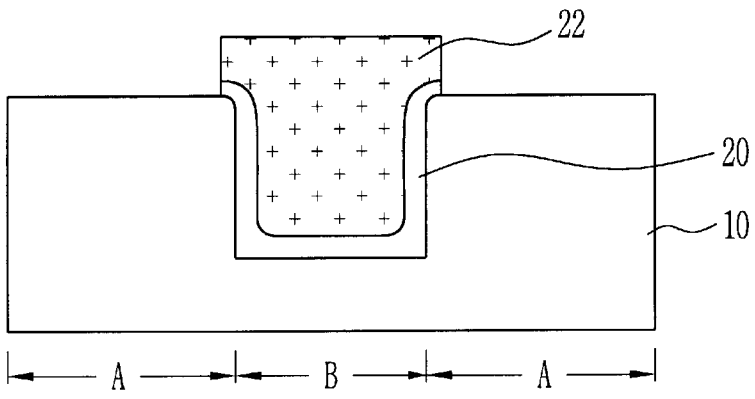

By reference to FIG. 2K, the pad oxide film 12 is removed to expose the semiconductor substrate 10. In concrete, the pad oxide film 12 is completely removed by performing a pre-cleaning process using SC-1 at a temperature of 50 through 80° C. for 5 through 15 minutes and then performing an etch process using a diluted solution of $HF:H_2O=1:19$ through $HF:H_2O=1:99$ for 10 through 60 seconds. At this time, the upper side and the sidewall of the HDP oxide film 22 of the nipple shape as well as the pad oxide film 12 are removed by an isotropic etch process using a HF solution. In other words, if the etch process is performed under the above conditions, the HDP oxide film 22 at the lateral direction of the field region 'B' is not removed but the HDP oxide film 22 protruded on the upper side of the active region 'A' is removed. As the HDP oxide film is protruded in the active region, formation of a moat formed since the HDP oxide film at the lateral direction of the field region was removed in the prior art can be reduced.

Figure 3:
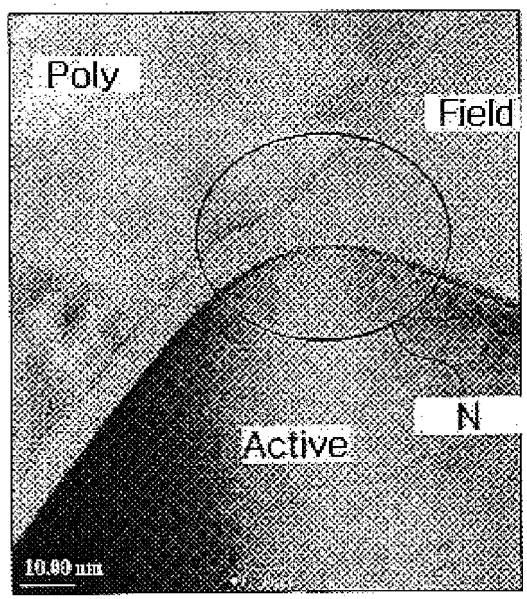
FIG. 3 is a TEM photography of the semiconductor device in which the device isolation film is formed according to the present invention.

FIG. 3 is a TEM photography of the semiconductor device in which the device isolation film is formed according to the present invention.

Referring now to FIG. 3, a gate electrode consisting of a gate oxide film and a polysilicon layer is formed by the process of manufacturing the semiconductor device. An ion implantation process is then performed to form source and drain. Examining the semiconductor device formed by the technology, it can be seen that a moat is not formed around the upper corner of the device isolation film where the active region 'A' and the field region 'B' meet and the upper corner portion of the device isolation film is rounded (see portion 'N' in FIG. 3).

As mentioned above, according to the present invention, when a trench of a STI structure is formed, a portion of a pad nitride film on an active region is removed. Therefore, the present invention has an advantageous effect that it can prevent formation of a moat around an upper corner portion of the trench of the STI structure.

Further, the present invention has outstanding effects that it can prevent a parasitic effect, degradation in gate oxide integrity, an inverse narrow effect and a sub-threshold hump phenomenon.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor device, comprising steps in order of:

(a) sequentially forming a pad oxide film, a pad nitride film and a screen oxide film on a semiconductor substrate in which an active region and a field region are defined;

(b) removing the screen oxide film and the pad nitride film formed in the field region;

(c) performing a wet etch process to remove a portion of the pad nitride film exposed at the boundary of the active region and the field region, in a lateral direction by a given width;

(d) performing a dry etch process using the screen oxide film as an etch mask to remove portions of the pad oxide film and the semiconductor substrate formed in the field region, thus forming a trench;

(e) removing the screen oxide film and simultaneously removing the exposed portion of the pad oxide film below said portion of the pad nitride film removed by the wet etch process;

(f) performing an oxidation process to form a rounding oxide film in the exposed portion of the semiconductor substrate after simultaneously removing the screen oxide film and the exposed portion of the pad oxide film;

(g) depositing a field oxide film of a thickness by which the trench is sufficiently buried and then polishing the field oxide film; and (h) removing the pad nitride film and the pad oxide film in the active region.

2. The method as claimed in claim 1, wherein the pad oxide film is formed to have a thickness sufficient to mitigate stress between the pad nitride film and the semiconductor substrate and to protect the semiconductor substrate during the wet etch process.

3. The method as claimed in claim 2, wherein the thickness of the pad oxide film is 30 through 75 Å.

4. The method as claimed in claim 1, wherein the screen oxide film serves as an etch mask in the dry etch process for forming the trench.

5. The method as claimed in claim 1, wherein the step (c) includes performing a wet etch process to remove the pad nitride film in an active region by a width of 200 through 500 Å.

6. The method as claimed in claim 5, wherein the wet etch process is performed using phosphoric acid ($H_3PO_4$) solution in which the pad nitride film has a high etch selective ratio against the pad oxide film and the screen oxide film, at a temperature of 100 through 130° C. for 300 through 750 seconds.

* * * * *